(12) United States Patent
Asano (10) Patent No.: US 11,294,445 B2
(45) Date of Patent: Apr. 5, 2022

(54) INFORMATION PROCESSING APPARATUS AND METHOD OF CONTROLLING INFORMATION PROCESSING APPARATUS

(71) Applicant: CANON KABUSHIKI KAISHA, Tokyo (JP)

(72) Inventor: Kohei Asano, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 69 days.

(21) Appl. No.: 16/711,282

(22) Filed: Dec. 11, 2019

(65) Prior Publication Data
US 2020/0201409 A1    Jun. 25, 2020

(30) Foreign Application Priority Data
Dec. 25, 2018 (JP) .............................. JP2018-241726

(51) Int. Cl.
*G06F 1/30* (2006.01)
*G06F 3/06* (2006.01)
*B41J 29/393* (2006.01)
*G01R 31/40* (2020.01)

(52) U.S. Cl.
CPC .............. *G06F 1/30* (2013.01); *B41J 29/393* (2013.01); *G01R 31/40* (2013.01); *G06F 3/0604* (2013.01); *G06F 3/0659* (2013.01); *G06F 3/0679* (2013.01)

(58) Field of Classification Search
CPC ................ Y02T 10/70; Y02T 10/7072; G09G 2310/066; G11C 7/1048; G11C 11/4076; G11C 11/4096; G06F 1/10; G06F 1/30

USPC ..... 361/155, 156; 365/185.23, 226; 713/340
See application file for complete search history.

(56) References Cited

U.S. PATENT DOCUMENTS

| 5,448,719 | A * | 9/1995 | Schultz | G06F 12/0866 711/141 |
| 6,725,397 | B1 * | 4/2004 | Emberty | G06F 11/1441 711/E12.04 |
| 8,031,551 | B2 * | 10/2011 | Wilson | G11C 5/141 365/228 |
| 8,495,406 | B2 * | 7/2013 | Hutchison | G06F 12/0802 713/340 |
| 10,325,631 | B1 * | 6/2019 | Rowley | G06F 1/30 |

(Continued)

FOREIGN PATENT DOCUMENTS

JP        2004-272309 A    9/2004

*Primary Examiner* — Faisal M Zaman
(74) *Attorney, Agent, or Firm* — Canon U.S.A., Inc. IP Division (57) ABSTRACT

An information processing apparatus includes a memory, a control unit to accept an access to the memory, a power supply circuit to supply a voltage to the memory and the control unit, a detection circuit to detect a drop in the voltage, a discharge circuit, and a delay circuit. The discharge circuit discharges a charge on a voltage supply line extending between the power supply circuit and the memory. The delay circuit delays receipt of a control signal by the discharge circuit for a predetermined period after the discharge circuit receives a charge discharge instruction from the control unit. The control signal is to control discharging the supply line charge. The discharge circuit discharges supply line charges per a control signal based on detection of a drop in the voltage by the detection circuit and based on the delay of the control signal delayed by the delay circuit.

17 Claims, 6 Drawing Sheets

(56) References Cited

U.S. PATENT DOCUMENTS

| | | | |
|---|---|---|---|
| 2004/0054484 A1* | 3/2004 | Farabaugh | G01R 31/386 702/63 |
| 2006/0179229 A1* | 8/2006 | Clark | G06F 12/0811 711/129 |
| 2007/0033431 A1* | 2/2007 | Pecone | G06F 11/3058 714/6.12 |
| 2007/0226411 A1* | 9/2007 | Ehrlich | G06F 12/0804 711/113 |
| 2007/0274132 A1* | 11/2007 | Ogiwara | G11C 5/14 365/185.23 |
| 2009/0222627 A1* | 9/2009 | Reid | G06F 12/0804 711/135 |
| 2010/0153347 A1* | 6/2010 | Koester | G06F 3/0613 707/691 |
| 2014/0006834 A1* | 1/2014 | Ishii | G06F 12/0866 713/340 |
| 2014/0195718 A1* | 7/2014 | Abraham | G06F 12/0804 711/103 |
| 2015/0193464 A1* | 7/2015 | Kwon | G06F 16/1815 707/648 |
| 2015/0309939 A1* | 10/2015 | Sadoughi-Yarandi | G06F 12/0895 711/135 |
| 2016/0077974 A1* | 3/2016 | Kim | G06F 12/0804 711/135 |
| 2017/0020019 A1* | 1/2017 | Tuma | G11C 5/04 |
| 2017/0068618 A1* | 3/2017 | Akiyama | G06F 12/0871 |
| 2017/0337102 A1* | 11/2017 | Engler | G06F 12/0868 |
| 2018/0011524 A1* | 1/2018 | Stumpf | G06F 1/28 |
| 2018/0039573 A1* | 2/2018 | Shung | G06F 12/0246 |
| 2019/0042418 A1* | 2/2019 | Dutta | G06F 12/0804 |

\* cited by examiner

INFORMATION PROCESSING APPARATUS AND METHOD OF CONTROLLING INFORMATION PROCESSING APPARATUS

BACKGROUND

Field

Present disclosure relates to an information processing apparatus and a method of controlling the information processing apparatus.

Description of the Related Art

An information processing apparatus may include a non-volatile storage apparatus. The storage apparatus may include a dedicated controller, a volatile cache memory, and a non-volatile storage medium. The dedicated controller may irregularly write data stored in the cache memory into the storage medium (a cache flush operation).

The information processing apparatus may include a plurality of devices disposed therein and may include a power sequence circuit for controlling a power-on timing and a reset timing of the devices. In particular, to provide a power-off sequence, the information processing apparatus may include a discharge circuit to discharge charges from a power supply line.

This discharge circuit also operates when a power failure or an instantaneous interruption occurs. It is not known in advance when an instantaneous interruption or a power failure will occur. Thus there is a possibility that when the discharge circuit is operating, a power failure or an instantaneous interruption occurs and data remaining in the cache of the non-volatile memory is lost if the cache flush is not correctly completed.

Japanese Patent Laid-Open No. 2004-272309 discloses a method for securing a cache flush time by switching a power supply line, via which power is supplied to the storage apparatus, to a backup power supply such as a battery or the like if data remains in the cache memory when a power failure occurs.

In this method in which the power supply is switched to the backup power supply in order to secure time for executing the cache flush operation, the information processing apparatus needs to include the backup power supply and a switching circuit. Furthermore, a management operation such as an operation of charging the backup power supply is required to be performed periodically.

SUMMARY

According to an aspect of the present disclosure, an information processing apparatus includes a nonvolatile semiconductor memory, a memory control unit configured to accept an access to the nonvolatile semiconductor memory, a power supply circuit configured to supply a power supply voltage to at least the nonvolatile semiconductor memory and the memory control unit, a detection circuit configured to detect a drop in the power supply voltage, a discharge circuit configured to discharge at least a charge on a power supply voltage supply line extending between the power supply circuit and the nonvolatile semiconductor memory, and a delay circuit configured to delay receipt of a control signal by the discharge circuit for a predetermined period after the discharge circuit receives a charge discharge instruction from the memory control unit, where the control signal is to control discharging the supply line charge, wherein the discharge circuit discharges supply line charges in accordance with a control signal based on detection of a drop in the power supply voltage by the detection circuit and based on the delay of the control signal delayed by the delay circuit.

Further features of the present disclosure will become apparent from the following description of exemplary embodiments with reference to the attached drawings.

DESCRIPTION OF THE EMBODIMENTS

Embodiments of the present disclosure are described in detail below with reference to the accompanying drawings. Note that these embodiments are described by way of example only and not limitation. Also, note that all features described in embodiments are not necessarily needed to practice the disclosure. In the following embodiments, an image processing apparatus is taken as an example of an information processing apparatus.

First Embodiment

Figure 1:
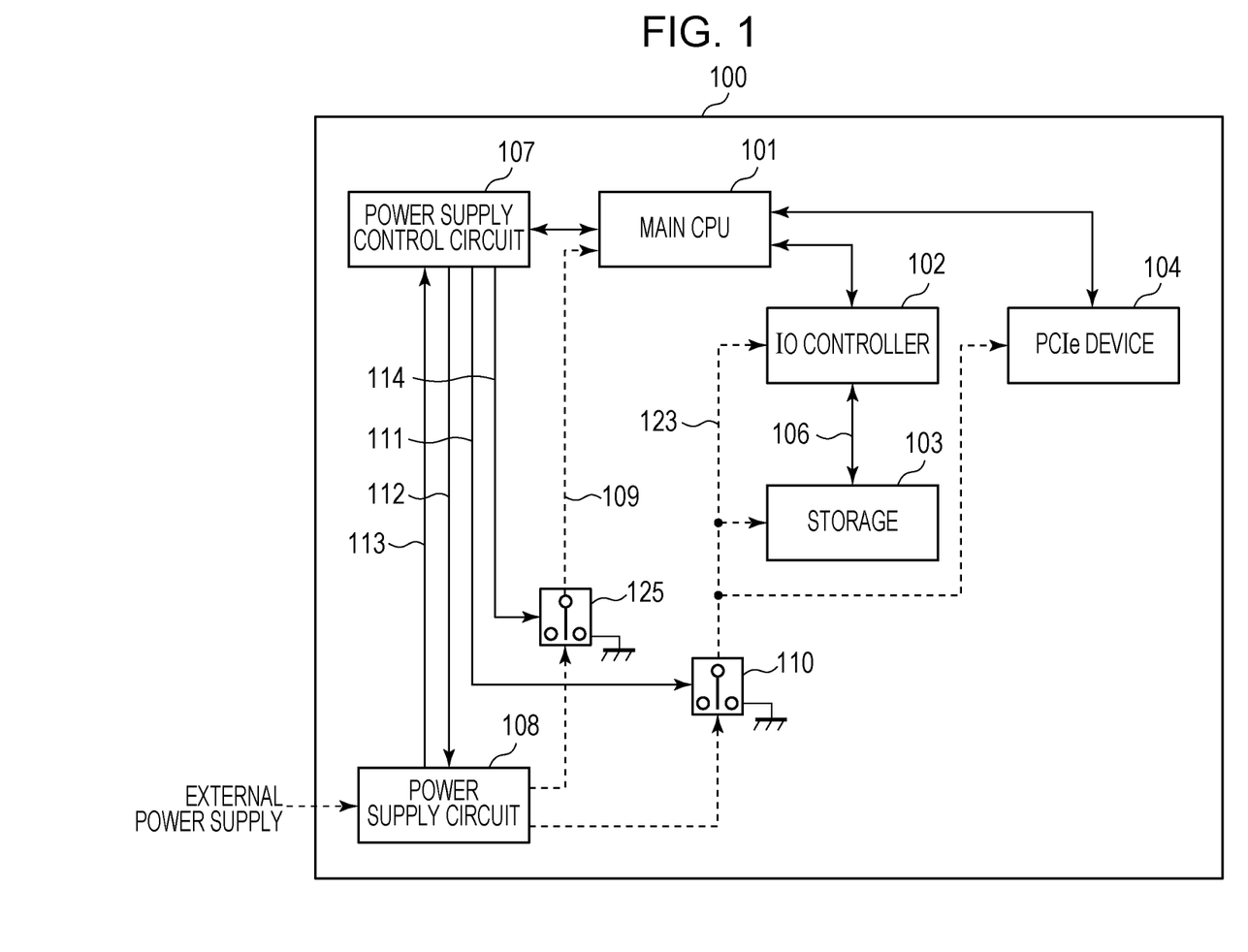
FIG. 1 is a block diagram of an information processing apparatus.

FIG. 1 is a block diagram of an information processing apparatus 100. The information processing apparatus 100 includes a main CPU 101, an IO controller 102, a storage 103, a peripheral component interconnect express (PCIe) device 104, a power supply control circuit 107, and a power supply circuit 108. In FIG. 1 and elsewhere, solid arrows represent communication lines, and broken arrows represent power lines.

The main CPU 101 controls the operation of the entire information processing apparatus 100. The main CPU 101 operates according to control software loaded in a RAM (not shown).

The IO controller 102 is connected to the main CPU 101 and the storage 103, and functions as a memory control unit. The IO controller 102 controls the storage 103 to store data necessary for operating the information processing apparatus 100 and also temporary data.

The storage 103 is a semiconductor memory and is supplied with a power supply voltage from the power supply circuit 108 via a power supply control line 123. The storage 103 is connected to an IO circuit via a communication line. The storage apparatus may be, for example, an SSD.

The main CPU 101 and the IO controller 102 are electrically connected to each other via a PCI-express communication line. The main CPU 101 is also connected to the PCIe device 104 via a communication line.

The power supply control circuit 107 controls a power supply sequence associated with the information processing apparatus 100. The power supply control circuit 107 is connected to the main CPU 101 via a communication line and operates according to instructions from the main CPU 101.

The power supply circuit 108 is connected to the power supply control circuit 107 via a power supply control line 109, and generates a plurality of low-voltage power sources based on power from an external power supply 126 under the control of the power supply control circuit 107. Between the power supply circuit 108 and each device, a power on/off circuit such as a switch 110 and a switch 125 is provided on the power line.

The switch 110 is controlled by a switch control signal 111 and an on/off circuit control signal 112 supplied from the power supply control circuit. The switch 125 is controlled by a switch control signal 114 and an on/off circuit control signal 112 supplied from the power supply control circuit. That is, a power supply sequence is generated by the power supply control circuit 107 by controlling the operations of the power on/off circuit as described above.

These on/off circuits also include one or more discharge circuits configured to discharge electric charges in response to an instruction by the on/off circuit control signal 112 supplied from the power supply control circuit 107. Furthermore, the power supply circuit 108 also provides a power state notification signal 113 that is issued, when a voltage drop of the external power supply due to a power failure or the like is detected, to notify the power supply control circuit 107 of the voltage drop. The power state notification signal has a Hi level (a Hi potential) in a normal state, and has a Lo level (a Lo potential) when a drop in the power supply voltage occurs.

Note that each signal is provided by a current flowing through a particular communication line denoted by a number as shown in FIG. 1 and also elsewhere in other embodiments described below.

Figure 2:
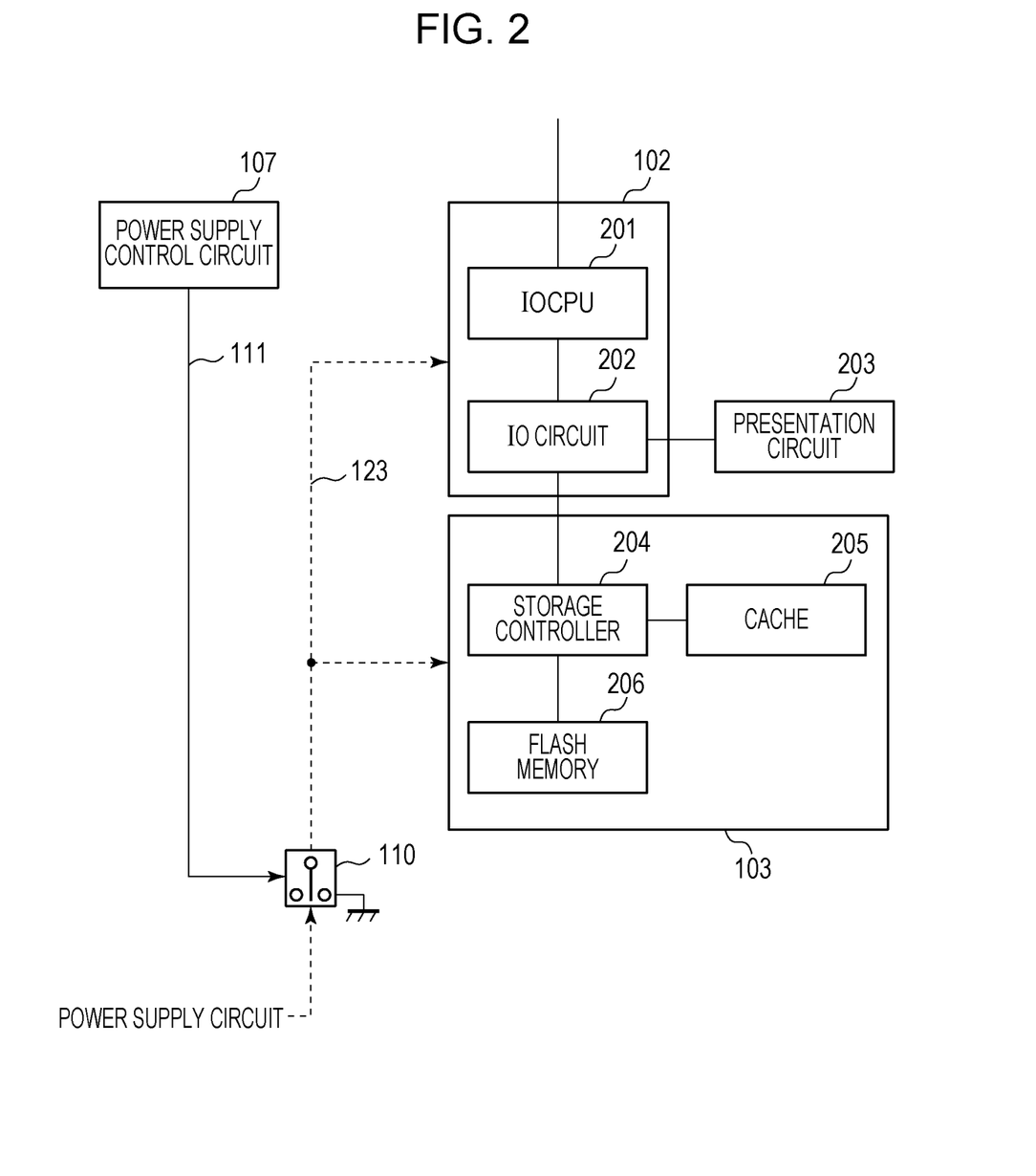
FIG. 2 is an internal block diagram illustrating a storage apparatus and its peripheral circuits.

Issues that may occur in a comparative example are described below with reference to FIG. 2 and FIG. 3A. FIG. 2 is an internal block diagram illustrating the storage 103 and its peripheral circuits. The IO controller 102 includes an IOCPU 201 and an IO circuit 202 specialized for IO-related operations. The IOCPU 201 transmits/receives commands to/from the main CPU 101 and manages the data to be transmitted/received and the state of the storage 103 under control.

Furthermore, the IO circuit 202 receives, from the IOCPU 201, data associated with command communication performed between the IOCPU 201 and the main CPU 101, and transfers the received data to the storage 103. Furthermore, the IO circuit 202 is also connected to a presentation circuit 203 such that the status of data transmission/reception to/from the storage described above can be presented to an external user by a change in voltage level. This presentation circuit 203 is configured using hardware. When an access to the IO controller 102 occurs, the presentation circuit 203 issues a notification of the occurrence of the access. The presentation circuit may be configured to include an access LED that presents an access state to the user, a control circuit that controls the LED, and the like. Circuits provided in the IO circuit to drive the presentation circuit operate by hardware control, and thus they can respond quickly.

The storage 103 includes a storage controller 204, a cache (a cache area) 205, and a flash memory (a memory area) 206. The storage controller 204 controls the entire storage 103 and is responsible for communication with the IOCPU 201.

The cache 205 is a volatile memory for temporarily storing data received by the storage controller 204 from the IO controller 102. The storage controller 204 writes data from the cache 205 to the nonvolatile flash memory 206 at irregular timings. This operation is referred to as a cache flush operation. Note that the cache flush operation is independent of the IO controller 102.

Figure 3A:
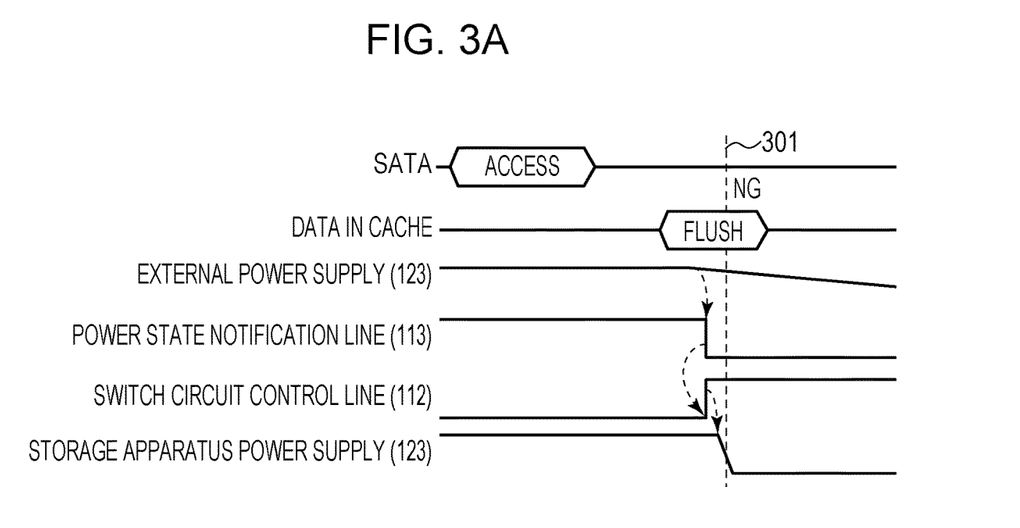
FIG. 3A is a power-off sequence diagram according to a comparative example.
Figure 3B:
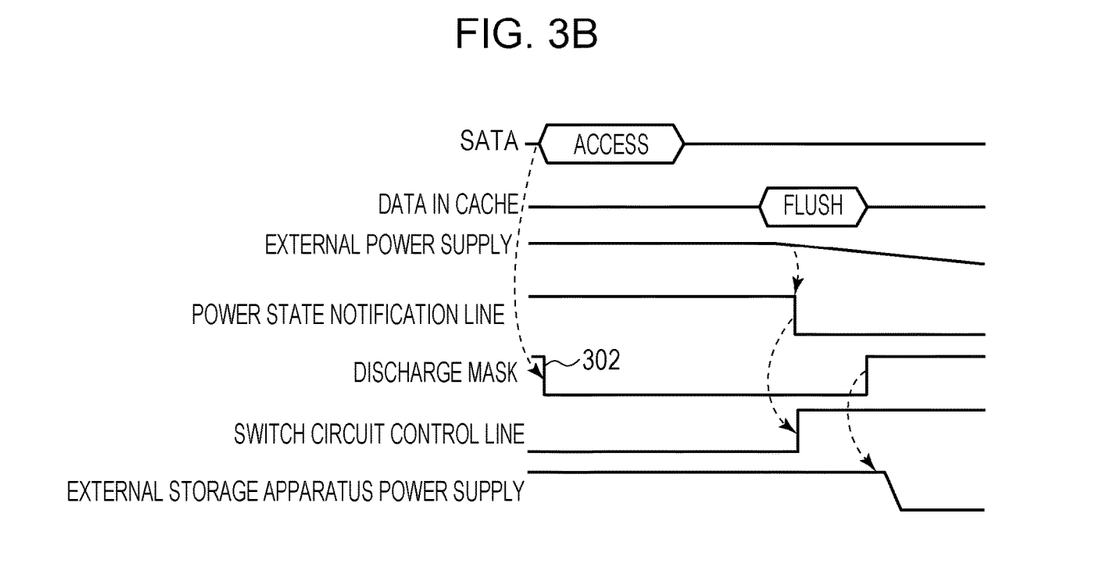
FIG. 3B is a power-off sequence diagram according to present disclosure.

FIGS. 3A and 3B each illustrate a sequence diagram associated with a turn-off operation of a power supply. First, referring to FIG. 3A, a power-off sequence in a comparative example is described and an issue that may occur is discussed.

FIG. 3A shows a power-off sequence for a case where a power failure occurs in a situation where a cache flush operation is necessary. Note that a similar situation occurs when an instantaneous interruption occurs.

When an access occurs on a Serial Advanced Technology Attachment (SATA) line 106, the IO controller 102 and the storage 103 operate such that data written in the storage 103 is stored in the cache 205. A cache flush operation is executed by the storage controller 204 at an arbitrary timing thereafter.

However, if a drop in the voltage of the external power supply occurs before the cache flush operation is executed for some reason, the following operation is performed.

In this case, the voltage drop is detected by the power supply circuit 108, and the power supply circuit 108 sets the power state notification signal 113 to the Lo level (Lo-level signals) to notify the power supply control circuit 107 of the occurrence of the voltage drop.

In response to receiving the notification, the power supply control circuit 107 sets the on/off circuit control signal 112, the switch control signal 114, and the switch control signal 111 to the Hi level (Hi-level signals). As a result, the switch 110 and the switch 125 go to a discharge state, and the power supply voltage applied to the storage 103 abruptly drops down (a discharge process).

Furthermore, the power supply control circuit notifies the main CPU 101 of the occurrence of the drop in the power supply voltage. In response to receiving the notification, the main CPU 101 notifies the IO circuit of the occurrence of the drop in the power supply voltage. In response to receiving the notification, the IO circuit instructs the storage 103 to write data (that is, to perform the cache flush operation).

However, when the cache flush operation is executed, the discharge operation is performed and thus charges on the power supply control line 123 are discharged. As a result, enough power is not provided to execute the cache flush operation, and thus data held in the cache 205 is not stored into the flash memory 206.

Note that in a case where the power of the information processing apparatus is normally turned off, when a power off instruction is received from a user, the main CPU 101 instructs the IO circuit to turn off the power. In response to receiving the instruction, the IO circuit instructs the storage controller to execute a cache flush operation. After the cache flush operation is finished, the power supply control circuit executes a discharge process under the control of the main CPU 101.

In view of the above, in the information processing apparatus according to the present embodiment, in a case where the cache flush operation is performed, the execution of the discharge process in the power-off process is delayed. A specific description is given below with reference to FIGS. 4 to 6 and FIG. 3B.

Figure 4:
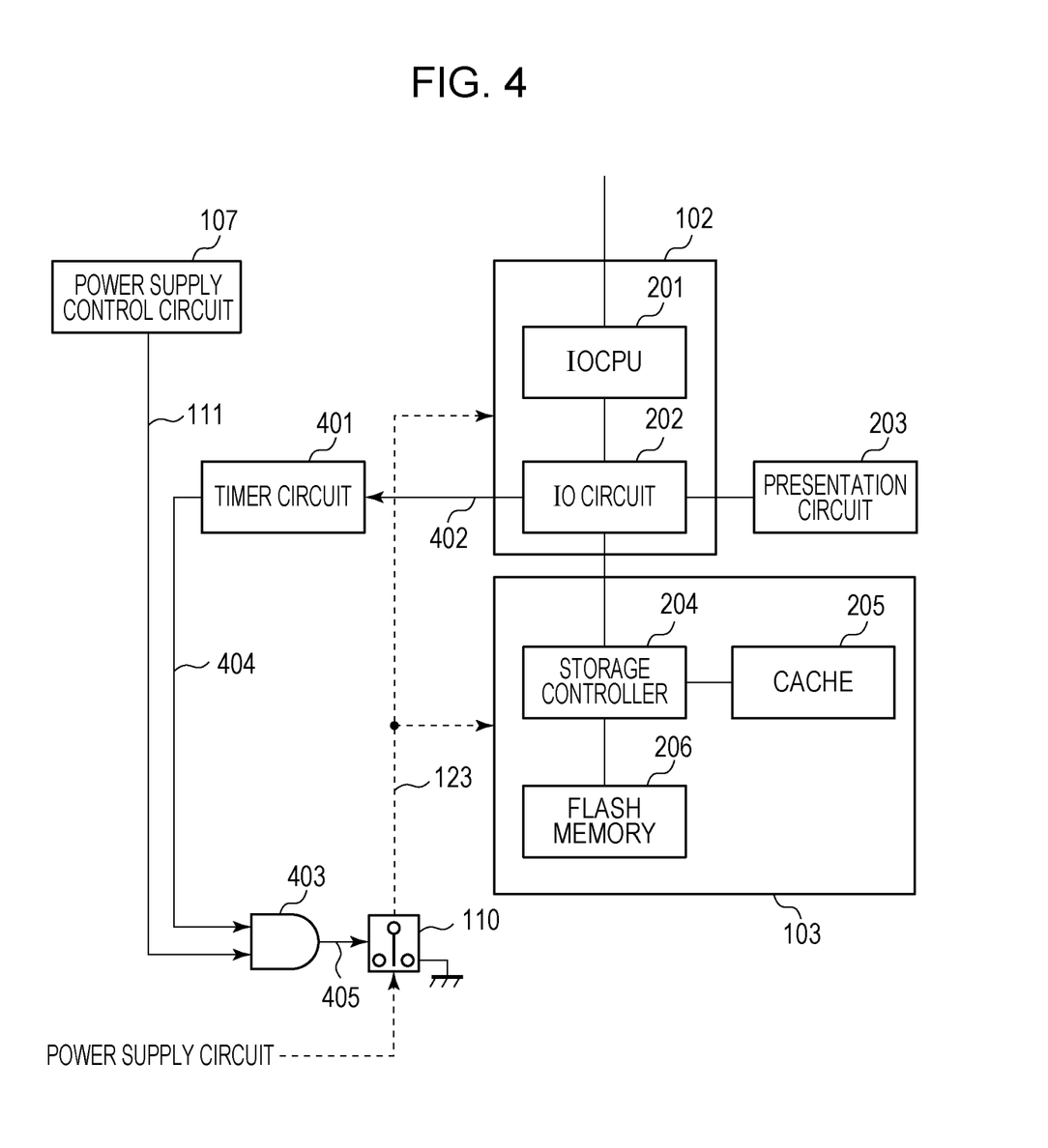
FIG. 4 is an internal block diagram illustrating a storage apparatus and its peripheral circuits.

FIG. 4 is an internal block diagram illustrating the storage 103 and its peripheral circuits in the information processing apparatus according to the present embodiment. The configuration shown in FIG. 4 is different from that shown in FIG. 2 in that a time circuit (a timer circuit) 401, a mask trigger signal 402, a mask circuit (a delay circuit) 403, a timer signal 404, and a mask signal 405 are provided.

When the IO circuit 202 receives a command to access the storage 103, the IO circuit 202 notifies the presentation circuit 203 of the reception of the access command. In synchronization therewith, the IO circuit 202 changes the mask trigger signal 402 input to the timer circuit 401 from Hi to Lo.

In a case where a drop in the power supply voltage occurs, the following operation is performed. That is, the power supply control circuit 107 notifies the main CPU 101 of the occurrence of the drop in the power supply voltage. In response to receiving the notification, the main CPU 101 instructs the IO circuit to perform a cache flush operation to transfer data from into the storage 103. When the IO controller 102 receives a command to access to the storage 103, the IO controller 102 changes the mask trigger signal 402 input to the timer circuit 401 from Hi to Lo.

The timer circuit 401 is connected to the IO controller 102 (the IO circuit 202) and the mask circuit 403, and the timer circuit 401 changes the signal level of the timer signal 404 (the signal input to the mask circuit 403) that is output in accordance with an instruction from the IO circuit 202.

More specifically, when a mask trigger signal with the Hi level is input from the IO circuit 202 to the timer circuit 401, the timer circuit 401 outputs a timer signal 404 with the Hi level.

When a mask trigger signal with the Lo level is input from the IO circuit 202 to the timer circuit 401, the timer circuit 401 outputs a timer signal 404 with the Lo level (that disables the discharge) for a predetermined period. That is, the timer circuit 401 is a circuit that latches the signal for a predetermined period of time when the mask trigger signal is at the Lo level. When the predetermined period of time has elapsed, the timer circuit 401 inputs a timer signal 404 with the Hi level to the mask circuit 403.

In a case where no drop in the power supply voltage is detected, the power supply control circuit 107 inputs a switch control signal 111 with the Lo level to the mask circuit. In a case where a drop in the power supply voltage is detected, the power supply control circuit 107 inputs a switch control signal 111 with the Hi level to the mask circuit.

The mask circuit 403 may be an AND circuit of a general type and is connected to the timer circuit 401 and the power supply control circuit 107. The mask circuit 403 outputs the mask signal 405 based on the timer signal 404 and the switch control signal 111 input from the timer circuit 401.

For example, when the switch control signal 111 with the Hi level and the timer signal 404 with the Hi level are input to the mask circuit 403, the mask circuit 403 outputs a mask signal with the Hi level (which allows the discharge). As a result, the output switch 110 goes into the discharge state.

For example, in a case where the switch control signal 111 with the Hi level and the timer signal 404 with the Lo level are input to the mask circuit 403, the mask circuit 403 outputs a mask signal with the Lo level (which disables discharge). In this case, the output switch 110 does not go into the discharge state.

Figure 5:
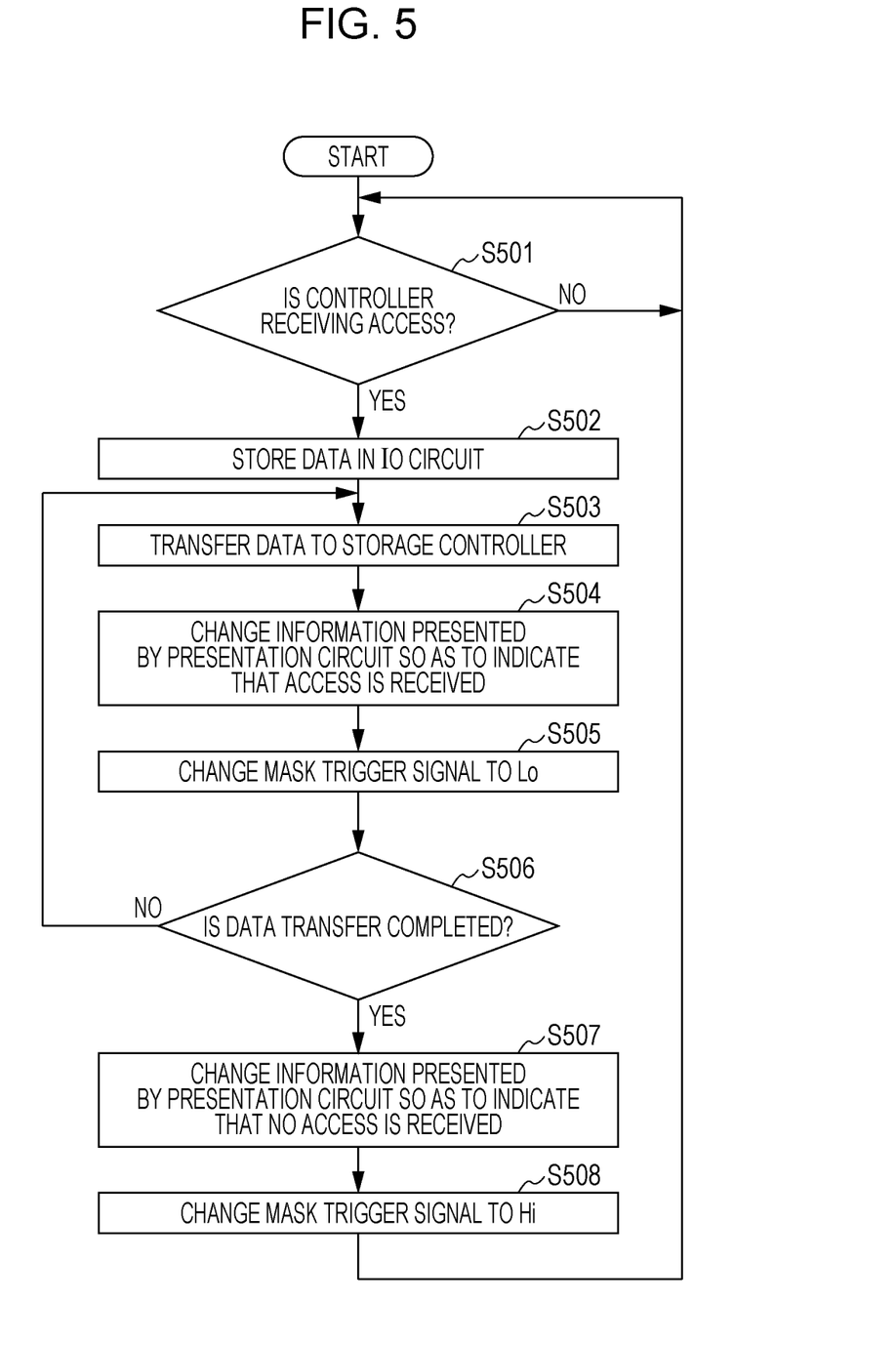
FIG. 5 is a flow chart illustrating operations of a storage apparatus and its peripheral circuits.

FIG. 5 is a flow chart showing a process in which the IO controller 102 controls the storage 103 to execute a write operation while performing discharge masking.

In step S501, the IO controller 102 monitors an occurrence of a write access from the upstream main CPU 101 to the storage 103. In a case where no write access is detected, step S501 is performed repeatedly until a write access is detected in step S501. In a case where the IO controller receives a write access instruction from the main CPU 101, the IO controller 102 proceeds to step S502.

In step S502, the IO controller 102 holds, in the IO circuit 202, data to be written. In this case, the IO controller 102 accesses the main CPU 101 and the storage controller 204 using a command. When step S502 is completed, the process proceeds to step S503.

In step S503, the IO controller 102 writes the data held in the IO circuit 202 into the storage controller 204. When step S503 is completed, the process proceeds to step S504.

In step S504, the IO controller 102 issues an outward notification via the presentation circuit 203 to notify that an access has been accepted. When step S504 is completed, the process proceeds to step S505.

In step S505, the IO controller 102 changes the mask trigger signal 402 from Hi to Lo. As a result, the timer signal 404 output from the timer circuit 401 transits to the Lo level, and the mask signal 405 output from the mask circuit 403 is not allowed to be at the Hi level for a predetermined period. Note that steps S503 to S505 may be performed simultaneously.

When step S505 is completed, the process proceeds to step S506.

The process from S503 to S506 is performed repeatedly until it is determined in S506 that the IO controller 102 has transmitted all write data to the storage controller 204. When the IO controller 102 finishes transmitting the write data to the storage controller 204, the process proceeds to step S507.

In step S507, the IO controller 102 changes the presentation circuit 203 so as to indicate a non-access state. When step S507 is completed, the process proceeds to step S508.

In step S508, the IO controller 102 changes the mask trigger signal 402 from Lo to Hi. When step S508 is completed, the process returns to step S501 in which the IO controller 102 waits for an access to occur. This state is maintained until no more access to the IO controller 102 occurs, that is, until the information processing apparatus 100 is powered off or goes into a power save mode.

The access may be, for example, receiving data from an external information processing apparatus and storing the received data in the storage 103 when a print job using a printer (not shown) is executed. In another example of an access, when a scan job is executed, a document may be read using a scanner (not shown), and the read image data may be stored in the storage 103.

Figure 6:
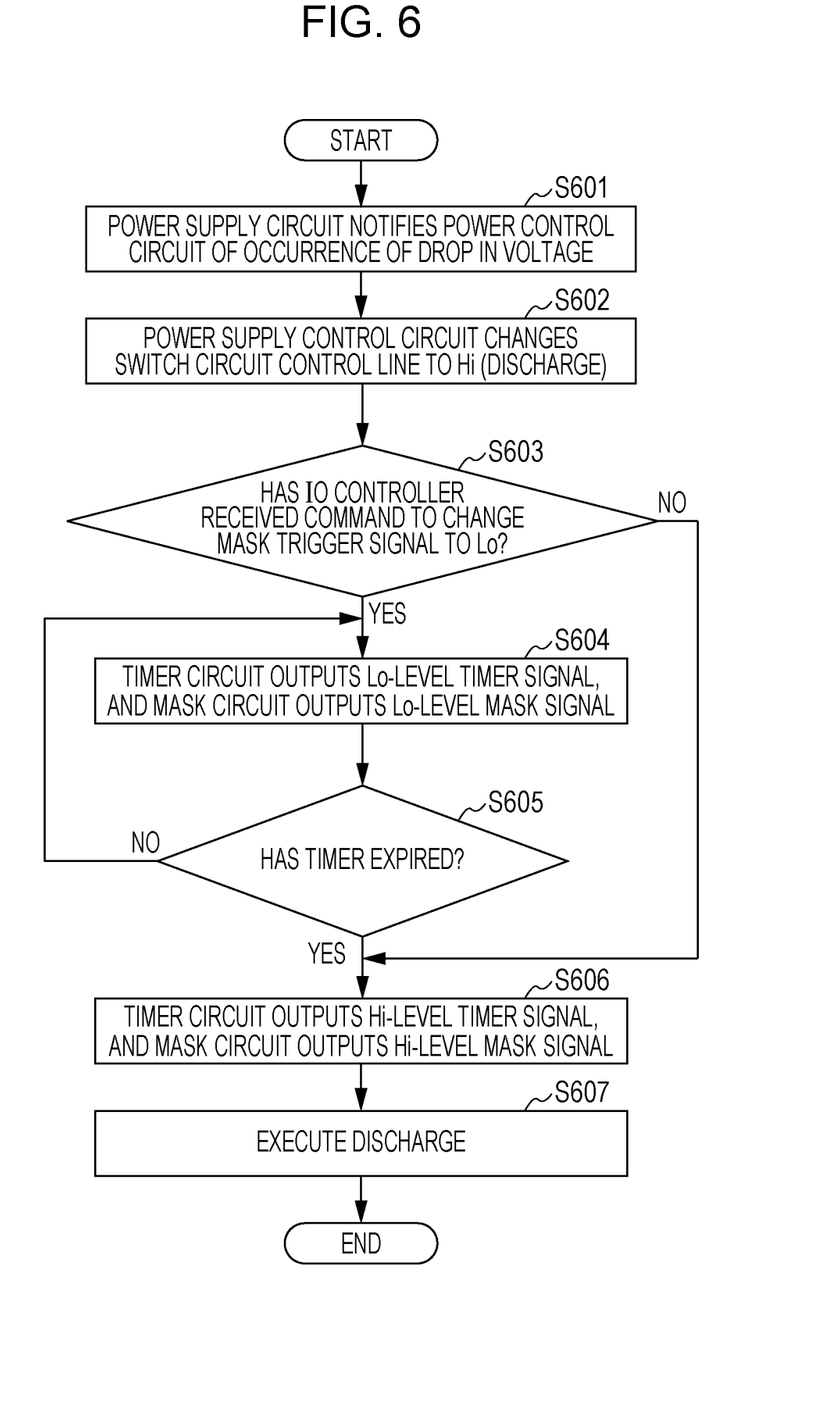
FIG. 6 is a flow chart illustrating a power-off operation.

FIG. 6 is a flow chart showing a process performed when a voltage drop in the external power supply occurs in a state where the IO controller 102 is being accessed while operating the mask signal 405.

When a voltage drop in the external power supply occurs due to a power failure or the like in step S601, the power supply circuit 108 detects the voltage drop and notifies, via the power state notification signal 113, the power supply control circuit 107 of the occurrence of the voltage drop. When step S601 is completed, the process proceeds to step S602.

In step S602, to turn off the information processing apparatus 100 into the power-off state, the power supply control circuit 107 changes the switching circuit control signal 112 and the switch control signals 111 and 114 to the Hi level in accordance with a power-off sequence predetermined in the system. In response, the power supply control circuit 107 controls the on/off circuits including the switch 110 and the switch 125 and the like to go to the discharge state.

In a case where it is determined in step S603 that the IO controller 102 has not received a command to set the mask trigger signal to the Lo level, the process proceeds to step S606. The description of step S606 will be given later.

In a case where it is determined in step S603 that the IO controller 102 has received a command to set the mask trigger signal to the Lo level, the process proceeds to step S603. Note that the receiving this command does not necessarily need to occur after the signal is changed in step S602. The changing in the signal in step S602 may be performed in a predetermined period in which the timer signal is at the Lo level after the command is received by the IO controller 102, or the changing in the signal in step S602 may be performed at the same time as the reception of the command.

The command to set the mask trigger signal to the Lo level may be the write command described with reference to FIG. 5 or a command to execute a cache flush operation. For example, in a case where the write command is not received by the IO controller 102, the CPU 101 transmits a command to the IO controller 102 to execute the cache flush operation to.

In step S604, the timer circuit 401 outputs a timer signal 404 with the Lo level for a predetermined period. That is, the mask signal 405 output from the mask circuit 403 is at the Lo level for the predetermined period, and the instruction of discharge is not issued to the switch 110 for the predetermined period (masked state).

The length of the predetermined period is equal to or longer than a time required for completing the cache flush operation by the storage controller 204. Note that the power supply control line 123 (supply line) is designed so as to be able to hold as much charge as required to execute the cache flush operation for at least the predetermined period. When step S604 is completed, the process proceeds to step S605.

Step S605 is performed repeatedly until the period set in the timer expires. When the period set in the timer expires, the process proceeds to step S606. Although not shown in the figure, the cache flush operation by the storage controller 204 is completed within the above-described delay time provided by the timer circuit 401. When step S605 ends, the process proceeds to step S606.

In step S606, the timer circuit 401 returns the signal level of the timer signal 404 to Hi (non-masked state). As a result, the mask signal 405 output from the mask circuit 403 has the Hi level. When step S606 is completed, the process proceeds to step S607.

In step S607, the mask signal 405 with the Hi level causes the discharge to be performed by the switch 110 or the switch 125. When step S607 ends, the processing flow ends.

FIG. 3B shows a series of these sequences described above. When the IO controller 102 and the storage 103 perform accessing using the SATA 106 line, a mask trigger signal 402 with the Lo level is simultaneously supplied by the timer circuit 401, and thus the mask signal 405 goes to the Lo level which is maintained for a predetermined period (302).

On the other hand, when a voltage drop in the external power supply occurs at an arbitrary time, the power supply circuit 108 sets the power state notification signal 113 to the Lo level and notifies the power supply control circuit 107 of the occurrence of the voltage drop. In response, the power supply control circuit 107 sets the on/off circuit control signal 112 to the Hi level.

However, even when the on/off circuit control signal 112 is at the Hi level, since the timer signal 404 input to the mask circuit 403 is at the Lo level, the output of the mask circuit 403, that is, the mask signal 405, which is given by the AND of the two input signals, is at the Lo level, and thus the discharge is not executed. That is, the charge discharge from the power supply control line 123 connected to the storage 103 is suppressed, and the storage controller 204 is capable of performing the cache flush operation using the remaining charge.

When the delay time provided by the timer circuit 401 expires, the mask trigger signal 402 goes to the Hi level. Therefore, the mask signal 405 output from the mask circuit 403 returns to the Hi level (non-masked state). As a result, the masking by the mask circuit 403 is removed, and thus discharge is executed to discharge the storage 103. More specifically, the power supply control line 123 is discharged, and no charge is supplied to the storage apparatus.

According to the present embodiment, as described above, when the IO controller 102 executes an instruction to write to the storage 103, the discharge is not performed for a predetermined period from the start of the write access. During this predetermined period, the storage controller 204 is capable of performing the cache flush operation using the charge remaining in the power supply control line 123 of the storage 103.

Furthermore, the circuit implementing the present embodiment can be realized using inexpensive and highly reliable components such as the timer circuit 401 and the mask circuit 403.

Furthermore, the series of operations according to the present embodiment is performed by the IO controller 102 independently without cooperation with the main CPU 101. Therefore, highly responsive control is possible. This allows it to secure time for executing the cache flush operation using the remaining charge even in a state in which the external power supply is unstable.

Since, in an example, the cache flush operation is performed completely independently of the state of the external power supply, it is possible to secure time for the storage controller to execute the cache flush operation using the remaining charge, even in a state in which an instantaneous interruption, a power failure occurs, or the like occurs.

According to the present disclosure, as described above, it is possible to secure time for executing the cache flush operation without management at regular intervals.

Other Embodiments

The present disclosure has been described above with reference to various examples and embodiments. Note that the spirit and scope of present disclosure are not limited to specific descriptions in the present specification.

The present disclosure may also be implemented such that a program to realize one or more functions of the above-described embodiments is supplied to a system or apparatus via a network or a storage medium, and one or more processors in a computer of the system or apparatus read and execute the program. The present disclosure may also be implemented by a circuit (for example, ASIC) that realizes one or more functions.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-241726, filed Dec. 25, 2018, which is hereby incorporated by reference herein in its entirety.

What is claimed is:

1. An information processing apparatus comprising:
a nonvolatile semiconductor memory including a cache area for temporarily storing data and a nonvolatile memory area;
a memory control unit configured to accept an access to the nonvolatile semiconductor memory;
a power supply circuit configured to supply a power supply voltage to at least the nonvolatile semiconductor memory and the memory control unit, wherein the power supply circuit is configured to detect a drop in the power supply voltage;
a discharge switch configured to discharge at least a charge on a power supply voltage supply line extending between the power supply circuit and the nonvolatile semiconductor memory in response to receiving a first control signal that enables charge discharging, and configured not to discharge a charge on the power supply voltage supply line in response to receiving the first control signal that disables charge discharging;
a power supply control circuit configured to, when a drop in the power supply voltage is detected by the power supply circuit, issue a notification that the power supply voltage has dropped, wherein the power supply control circuit is configured to output a second control signal in response to detecting the drop in the power supply voltage by the power supply circuit;
a processor configured to transmit a first instruction for causing cache flush processing of writing data stored in the cache area into the nonvolatile memory area to the memory control unit in response to receiving, from the power supply control circuit, the notification that the power supply voltage has dropped;
a timer circuit configured to receive a signal that is based on the first instruction from the memory control unit and, based on the signal, control output of a third control signal; and
a discharge control circuit configured to receive the second control signal from the power supply control circuit, receive the third control signal from the timer circuit, and control output of the first control signal to the discharge switch based on the second control signal and the third control signal,
wherein the timer circuit causes the discharge control circuit to output the third control signal for outputting the first control signal that disables the charge discharging until a predetermined period elapses after the signal that is based on the first instruction is received from the memory control unit and causes the discharge control circuit to output the third control signal for outputting the first control signal that enables the charge discharging after the predetermined period elapses, and
wherein the predetermined period is longer than a period for executing the cache flush processing.

2. The information processing apparatus according to claim 1, wherein the third control signal for outputting of the first control signal that disables the charge discharging is a Lo-level signal, and the third control signal for outputting the first control signal that enables the charge discharging is a Hi-level signals.

3. The information processing apparatus according to claim 1,
wherein the power supply circuit is configured to monitor a power supply voltage supplied from an external apparatus, and
wherein, in a case where a power supply voltage drop occurs, the power supply voltage drop occurs due to a power failure or an instantaneous interruption.

4. The information processing apparatus according to claim 1, wherein the discharge control circuit is an AND circuit.

5. The information processing apparatus according to claim 1, wherein the access is an access to the nonvolatile semiconductor memory by executing a printing job.

6. The information processing apparatus according to claim 1, wherein the access is an access to the nonvolatile semiconductor memory by executing a scan job.

7. A method of controlling an information processing apparatus having a nonvolatile semiconductor memory including a cache area for temporarily storing data and a nonvolatile memory area, a memory control unit, a power supply circuit, a detection circuit, a discharge circuit, and a delay circuit, the method comprising:
accepting, via the memory control unit, an access to the nonvolatile semiconductor memory;
supplying, via the power supply circuit, a power supply voltage to at least the nonvolatile semiconductor memory and the memory control unit;
detecting, via the detection circuit, a drop in the power supply voltage;
discharging, via the discharge switch, at least a charge on a power supply voltage supply line extending between the power supply circuit and the nonvolatile semiconductor memory in response to receiving a first control signal that enables charge discharging, and not to discharging a charge on the power supply voltage supply line in response to receiving the first control signal that disables charge discharging;
when a drop in the power supply voltage is detected by the power supply circuit, issuing a notification that the power supply voltage has dropped;
outputting a second control signal in response to detecting the drop in the power supply voltage by the power supply circuit;

transmitting a first instruction for causing cache flush processing of writing data stored in the cache area into the nonvolatile memory area to the memory control unit in response to receiving, from the power supply control circuit, the notification that the power supply voltage has dropped;

receiving a signal that is based on the first instruction from the memory control unit and, based on the signal, control outputting of a third control signal; and receiving, via a discharge control circuit, the second control signal from the power supply control circuit, receiving the third control signal from the timer circuit, and control outputting of the first control signal to the discharge switch based on the second control signal and the third control signal, wherein the timer circuit causes the discharge control circuit to output the third control signal for outputting the first control signal that disables the charge discharging until a predetermined period elapses after the signal that is based on the first instruction is received from the memory control unit and causes the discharge control circuit to output the third control signal for outputting the first control signal that enables the charge discharging after the predetermined period elapses, and wherein the predetermined period is longer than a period for executing the cache flush processing.

8. A non-transitory computer-readable storage medium storing a program to cause a computer to perform a method of controlling an information processing apparatus having a nonvolatile semiconductor memory including a cache area for temporarily storing data and a nonvolatile memory area, a memory control unit, a power supply circuit, a detection circuit, a discharge circuit, and a delay circuit, the method comprising:

accepting, via the memory control unit, an access to the nonvolatile semiconductor memory;

supplying, via the power supply circuit, a power supply voltage to at least the nonvolatile semiconductor memory and the memory control unit;

detecting, via the detection circuit, a drop in the power supply voltage;

discharging, via the discharge switch, at least a charge on a power supply voltage supply line extending between the power supply circuit and the nonvolatile semiconductor memory in response to receiving a first control signal that enables charge discharging, and configured not to discharge a charge on the power supply voltage supply line in response to receiving the first control signal that disables charge discharging;

when a drop in the power supply voltage is detected by the power supply circuit, issuing a notification that the power supply voltage has dropped, wherein the power supply control circuit is configured to output a second control signal in response to detecting the drop in the power supply voltage by the power supply circuit;

transmitting a first instruction for causing cache flush processing of writing data stored in the cache area into the nonvolatile memory area to the memory control unit in response to receiving, from the power supply control circuit, the notification that the power supply voltage has dropped;

receiving a signal that is based on the first instruction from the memory control unit and, based on the signal, control outputting of a third control signal; and receiving, via a discharge control circuit, the second control signal from the power supply control circuit, receiving the third control signal from the delay circuit, and control outputting of the first control signal to the discharge switch based on the second control signal and the third control signal, wherein the timer circuit causes the discharge control circuit to output the third control signal for outputting the first control signal that disables the charge discharging until a predetermined period elapses after the signal that is based on the first instruction is received from the memory control unit and causes the discharge control circuit to output the third control signal for outputting the first control signal that enables the charge discharging after the predetermined period elapses, and wherein the predetermined period is longer than a period for executing the cache flush processing.

9. The information processing apparatus according to claim 1, wherein the discharge control circuit outputs the first control signal that enables the charge discharging to the discharge circuit in response to receiving the second control signal from the power supply control circuit and receiving the third control signal for outputting the first control signal that enables the charge discharging from the timer circuit.

10. The information processing apparatus according to claim 1, wherein the discharge control circuit outputs the first control signal that disables the charge discharging to the discharge switch in response to receiving the second control signal from the power supply control circuit and receiving the third control signal for outputting the first control signal that disables the charge discharging from the timer circuit.

11. The information processing apparatus according to claim 1, wherein the discharge circuit discharges a charge after the cache flush processing is completed.

12. The method according to claim 7, further comprising outputting, via the discharge control circuit, the first control signal that disables the charge discharging to the discharge switch in response to receiving the second control signal from the power supply control circuit and receiving the third control signal for outputting the first control signal from the timer circuit.

13. The method according to claim 7, wherein the discharging discharges a charge after the cache flush processing is completed.

14. The method according to claim 7, further comprising outputting the first instruction to the memory control unit in response to receiving the notification about the drop in the power supply voltage from the power supply control circuit.

15. The non-transitory computer-readable storage medium according to claim 8, further comprising outputting, via the discharge control circuit, the first control signal that disables the charge discharging to the discharge switch in response to receiving the second control signal from the power supply control circuit and receiving the third control signal for outputting the first control signal from the timer circuit.

16. The non-transitory computer-readable storage medium according to claim 8, wherein the discharging discharges a charge after the cache flush processing is completed.

17. The non-transitory computer-readable storage medium according to claim 8, further comprising outputting the first instruction to the memory control unit in response to receiving the notification about the drop in the power supply voltage from the power supply control circuit.

* * * * *